US012661868B2

(12) United States Patent
Liang et al.

(10) Patent No.: US 12,661,868 B2
(45) Date of Patent: Jun. 23, 2026

(54) GRAPHENE COPPER COMPOSITE MATERIAL PREPARATION METHOD BASED ON COMBINATION OF HOT PRESSING SINTERING AND CHEMICAL VAPOR DEPOSITION

(71) Applicant: CRRC INDUSTRIAL INSTITUTE CORPORATION LIMITED, Beijing (CN)

(72) Inventors: Juncai Liang, Beijing (CN); Xiaohui Zhang, Beijing (CN); Minggao Li, Beijing (CN); Zhongzheng Pei, Beijing (CN); Baishan Liu, Beijing (CN); Yalun Wang, Beijing (CN); Chaozhong Chen, Beijing (CN); Meiyu Sun, Beijing (CN)

(73) Assignee: CRRC INDUSTRIAL INSTITUTE CORPORATION LIMITED, Beijing (CN)

( * ) Notice: Subject to any disclaimer, the term of this patent is extended or adjusted under 35 U.S.C. 154(b) by 0 days.

(21) Appl. No.: 18/729,469

(22) PCT Filed: Jul. 12, 2022

(86) PCT No.: PCT/CN2022/105229
§ 371 (c)(1),
(2) Date: Jul. 16, 2024

(87) PCT Pub. No.: WO2023/216411
PCT Pub. Date: Nov. 16, 2023

(65) Prior Publication Data
US 2025/0162284 A1 May 22, 2025

(30) Foreign Application Priority Data
May 13, 2022 (CN) .......................... 202210531619.X

(51) Int. Cl.
*C23C 16/56* (2006.01)
*B32B 15/04* (2006.01)
(Continued)

(52) U.S. Cl.
CPC ............ *B32B 15/043* (2013.01); *B32B 15/20* (2013.01); *B32B 37/1045* (2013.01);
(Continued)

(58) Field of Classification Search
CPC .............................. B32B 15/20; B32B 15/043
See application file for complete search history.

(56) References Cited

U.S. PATENT DOCUMENTS

2015/0225844 A1* 8/2015 Van Baarle ............ B82Y 30/00
427/249.1
2018/0102197 A1* 4/2018 Adams ............... H01B 13/0016
(Continued)

FOREIGN PATENT DOCUMENTS

CN 106584976 A * 4/2017 ............ C23C 16/26
CN 109811175 A 5/2019
(Continued)

OTHER PUBLICATIONS

International Search Report, Dec. 16, 2022, for PCT/CN2022/105229, including English Language translation of the International Search Report.
(Continued)

*Primary Examiner* — Cachet I Proctor
(74) *Attorney, Agent, or Firm* — John P. White

(57) ABSTRACT

A graphene copper composite material preparation method based on a combination of hot pressing sintering and chemical vapor deposition, comprising: presetting multi-layer copper foil in a hot pressing chamber; preparing a graphene thin film on the surface of the copper foil by means of a chemical vapor deposition method to obtain a graphene
(Continued)

copper composite material; and then performing hot pressing forming on the multi-layer graphene copper foil material to prepare the graphene copper composite material. Said material can replace a traditional copper material or silver material, is applied to a supercapacitor or a motor driving device, and has the effects of improving efficiency, reducing temperature rise, etc.

18 Claims, 2 Drawing Sheets

(51) Int. Cl.

| | |
|---|---|
| *B32B 15/20* | (2006.01) |
| *B32B 37/10* | (2006.01) |
| *B32B 37/24* | (2006.01) |
| *B32B 38/16* | (2006.01) |
| *C01B 32/186* | (2017.01) |
| *C01B 32/194* | (2017.01) |
| *C23C 16/02* | (2006.01) |
| *C23C 16/26* | (2006.01) |

(52) U.S. Cl.
CPC ............ *B32B 37/24* (2013.01); *B32B 38/162* (2013.01); *C01B 32/186* (2017.08); *C01B 32/194* (2017.08); *C23C 16/0227* (2013.01); *C23C 16/26* (2013.01); *C23C 16/56* (2013.01);

*B32B 2037/246* (2013.01); *B32B 2250/05* (2013.01); *B32B 2255/06* (2013.01); *B32B 2255/20* (2013.01); *B32B 2255/28* (2013.01); *B32B 2307/202* (2013.01); *B32B 2307/302* (2013.01); *B32B 2307/7376* (2023.05); *B32B 2311/12* (2013.01); *B32B 2457/00* (2013.01); *C01B 2204/04* (2013.01)

(56) References Cited

U.S. PATENT DOCUMENTS

| | | | | |
|---|---|---|---|---|
| 2019/0062921 A1* | 2/2019 | Adams | ................. | C01B 32/186 |
| 2019/0066879 A1* | 2/2019 | Adams | ................. | C23C 16/545 |

FOREIGN PATENT DOCUMENTS

| | | | | |
|---|---|---|---|---|
| CN | 110079784 A | | 8/2019 | |
| CN | 110699666 A | | 1/2020 | |
| CN | 114425901 A | * | 5/2022 | .......... C01B 32/184 |
| CN | 114433627 A | | 5/2022 | |

OTHER PUBLICATIONS

First Office Action, Feb. 9, 2023, for Chinese Patent Application No. Cn 202210531619.X.

* cited by examiner

GRAPHENE COPPER COMPOSITE MATERIAL PREPARATION METHOD BASED ON COMBINATION OF HOT PRESSING SINTERING AND CHEMICAL VAPOR DEPOSITION

CROSS-REFERENCE TO RELATED APPLICATION

The present application is a § 371 national stage of PCT International Application No. PCT/CN2022/105229, filed Jul. 12, 2022, claiming priority of Chinese Patent Application No. 202210531619.X, filed on May 13, 2022, entitled "Graphene copper composite material preparation method based on combination of hot pressing sintering and chemical vapor deposition", the entire disclosure of each of which is hereby incorporated by reference in its entirety.

TECHNICAL FIELD

The present application relates to the field of materials technology, and specifically relates to a graphene copper composite material preparation method based on combination of hot pressing sintering and chemical vapor deposition.

BACKGROUND ART

Pure metals have always been considered to have the lowest electrical conductivity at room temperature. Since the electrical conductivity of copper was first officially recorded about 100 years ago, extensive research on highly refined copper has only improved the electrical conductivity by about 3%. The currently widely implemented International Annealed Copper Standard (IACS) records that the electrical conductivity of pure copper at room temperature is $5.8 \times 10^7$ S/m. Among metals, only silver has a higher electrical conductivity than copper (about 108% IACS), but its cost is too high. Therefore, copper-based materials have always been in service as the main conductive material.

In order to improve the conductivity of copper-based materials, methods of preparing high-purity copper by improving purity, reducing grain boundaries, and reducing defects have gradually approached the physical limit, the cost has increased significantly, and technical requirements have become more and more rigorous. However, when adding other alloy materials (such as tin, rare earth elements), there are also phenomena resulting in a decrease in the electrical conductivity due to unstable processes or lattice distortion of the copper matrix, which has certain limitations. The preparation of ultra-high conductive copper-based composite materials by combining metal copper with new materials has attracted extensive research.

Graphene is a two-dimensional material with only one atomic layer thickness and is the best known material for electrical properties. Copper-based composite materials with graphene as reinforcement are currently the most promising systems to achieve ultra-high conductivity. Research on the preparation of graphene-reinforced copper-based composite materials has important social and market value for the development of ultra-high conductive copper.

SUMMARY

The present application provides a graphene copper composite material preparation method, and the graphene copper composite material prepared by this method has an electrical conductivity between 108% IACS and 118% IACS, a density of ≥99.8%, and a thermal conductivity of 400 W/(m·k).

A graphene copper composite material preparation method, comprising:

1) presetting multi-layers of copper foils in a hot pressing chamber;
2) preparing a graphene thin film on the surface of the copper foil by means of a chemical vapor deposition (CVD) process with methane as a carbon source to obtain a graphene copper raw material; and
3) performing hot pressing sintering forming on the graphene copper raw material by means of a hot pressing sintering process to obtain a graphene copper composite material.

Specifically, the preparation method further comprises the step of further processing the graphene copper composite material with a multi-layer structure. Specifically, mechanical processing equipment can be used to process finished products that meet the required size and surface quality.

Specifically, the spacing between copper foils is controlled between 0.1 to 1 mm. The spacing between copper foils can be controlled using tooling fixtures. Research has found that the spacing between copper foils is controlled between 0.1 to 1 mm.

Specifically, the copper foil has a purity of ≥99.9%, such as 99.9% to 99.9999%, specifically such as 99.9%, 99.99%, 99.999%, and 99.9999%. Preferably, the copper block has a purity of ≥99.99%. Low-purity copper foil has a high impurity content, which is not conducive to the growth of graphene, and impurity elements affect the transport of electrons, which inhibits the improvement of electrical conductivity. As the purity of copper foil increases, the cost of its corresponding raw material also increases exponentially. To meet the needs of actual production, copper foil with a purity of 99.99% is selected. The performance of the graphene copper-based composite material prepared by the copper block with a purity of 99.99% is at the same level as that of the copper block with a purity of 99.999%.

Specifically, the copper foil is a rolled copper foil with an orientation of (111). When the orientation is (111), the graphene has the best growth quality, the smallest wrinkles, and the highest electrical performance.

Specifically, the copper foil has a thickness of 15 to 25 μm. When the thickness of the copper foil is less than 15 μm, the strength of the copper foil is insufficient and is prone to deformation and generating wrinkles, which is not conducive to the deposition of graphene and pressing forming. When the thickness of the copper foil is higher than 25 μm, as the thickness of the copper foil increases, the doping ratio of graphene decreases, resulting in a smaller increase in the electrical performance of the prepared sample.

Specifically, the method further includes the step of performing a hydrogen reduction treatment on the copper foil to remove the gas adsorbed on the surface and oxide layer before depositing the graphene thin film.

Specifically, molybdenum alloy press rams are installed on the upper and lower sides of the copper foil. Molybdenum alloy has high elastic modulus and thermal conductivity, such that the deformation of copper foil during the pressing process can be easily controlled.

Specifically, the vapor deposition is performed under a temperature of 950° C. to 1020° C. Specifically, graphene is deposited on both the upper and lower sides of the copper foil, and the number of layers of the prepared graphene film is optionally 1 to 5 layers, such as 1 layer, 2 layers, 3 layers, 4 layers, and 5 layers, depending on the preparation technology. The fewer the number of layers of graphene material, the higher the requirements for preparation technology and equipment, and the higher the corresponding cost. Depending on the material properties, when the number of graphene layers is less than 5, it still possesses a different electronic structure from a three-dimensional graphite. Graphene with a single layer exhibits excellent performance but will produce wrinkles, which will disrupt the hexagonal symmetric lattice structure of graphene and generate long-range scattering barriers leading to an increase in resistance. Therefore, the preparation process is extremely important for controlling the number of graphene layers. The grades of graphene layers in this preparation method are divided into single-layer graphene (1 layer), double-layer graphene (2 layers), and multi-layer graphene (3 layers, 4 layers, and 5 layers).

Specifically, the hot pressing sintering is performed under a hot pressing atmosphere of a high vacuum, reaching $5.5 \times 10^{-3}$ Pa or above, a hot pressing temperature of 850° C. to 1050° C., and a pressure of 20 MPa to 60 MPa, such as 25 MPa to 40 MPa.

Specifically, the total number of layers of the graphene copper composite material is 10 to 1000 layers, such as 10, 20, 30, 50, 100, 200, 300, 400, 500, 600, 800, 900, and 1000 layers. The thickness of the applied target product determines the total number of layers of the graphene copper composite material. Due to differences in the number of layers, the proportion of graphene varies. According to the test results of electrical performance, when the number of graphene layers increases from 10, 50 and 100 layers, the electrical conductivity will increase slightly from 108% IACS to 112% IACS. When the total number of layers exceeds 200, the electrical conductivity tends to be consistent with the change in the number of layers.

The total number of layers refers to the number of layers of all copper thin films and graphene thin films.

Specifically, the operation of preparing graphene thin films and the operation of hot pressing sintering in the preparation method are performed in a same chamber. This can avoid the introduction of impurity elements and the damage of mechanical stress during the transfer process of graphene thin films, and ensure the integrity and uniformity of graphene thin films in copper matrix.

The present application also includes graphene copper composite materials prepared by the above-mentioned method. This material can replace traditional copper or silver materials and be applied in supercapacitors or motor drive devices to improve efficiency and reduce temperature rise.

The present application has at least one of the following technical effects:

(1) In the present application, the preparation process is simple and reproducible, which is conducive to industrial large-scale production. Through experiments with different number of layers, a graphene copper composite material with a good interface bonding effect was obtained, which improves the conductivity of the material, and the temperature rise is reduced, and efficiency is improved during the application process of a flat-panel transformer.

(2) In the present application, the preparation of graphene thin films and the hot pressing sintering forming of raw materials for two materials are performed in a same chamber, which avoids the introduction of impurity elements and the damage of mechanical stress during the transfer process of graphene thin films, and ensures the integrity and uniformity of graphene thin films in the copper matrix.

SPECIFIC MODES FOR CARRYING OUT THE EMBODIMENTS

The present application is described in detail below in conjunction with examples, but the protection scope of the present application is not limited to the following examples.

Figure 1:
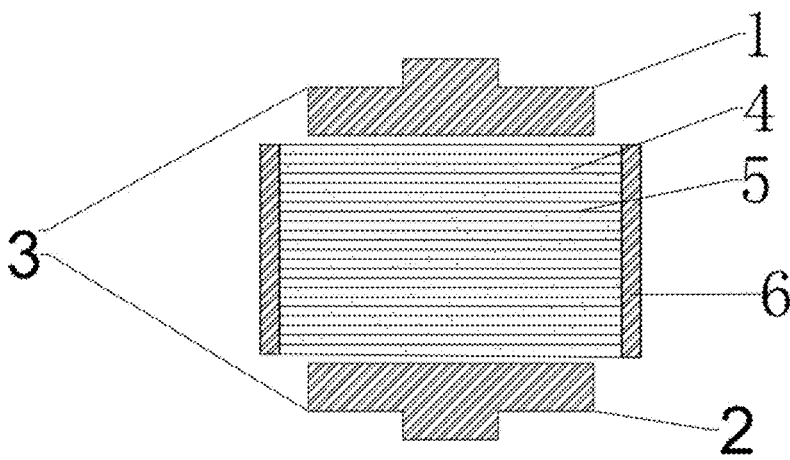
FIG. 1 is a schematic structural diagram of all equipment for preparing the graphene copper composite material in the examples of the present application.

The graphene copper composite material in the following examples can be prepared using the equipment shown in FIG. 1. In FIG. 1, 1: upper press ram; 2: lower press ram; 3: pressing system; 4: deposition area of graphene thin films; 5: copper foils with high purity; 6: copper foil fixture.

The preparation method of the graphene copper composite material in the following examples is specifically as follows:

The present application adopts the following technical solutions:

Step A: loading materials, multi-layers of copper foils were preset in a hot pressing chamber, and the spacing between copper foils was controlled to a spacing between 0.1 to 1 mm using tooling fixtures; the thickness of copper foil was 25 μm;

Step B: CVD process, methane was used as a carbon source to prepare graphene thin films on the surface of the copper foil preset in Step A; and Step C: hot pressing sintering, molybdenum alloy press rams were installed on the upper and lower sides of multi-layer copper foil, and hot pressing sintering was performed using the graphene copper raw material prepared in step B to obtain a graphene copper composite material.

After further processing, the resulted graphene copper composite material was made into 20 mm (length)×20 mm (width)×1 mm (height).

Figure 2:
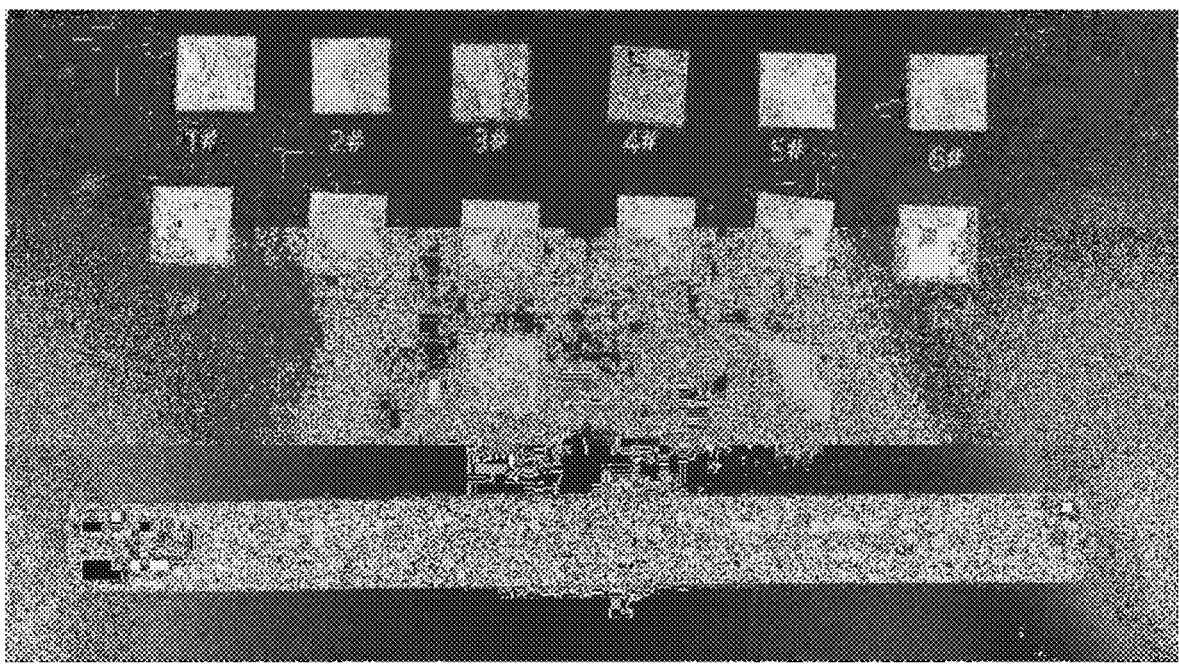
FIG. 2 is a physical photograph of the graphene copper composite material prepared in the examples of the present application.

FIG. 2 is a photograph of the graphene copper composite material prepared in the examples, wherein numbers 1 to 14 correspond to Examples 1 to 14.

Figure 3:
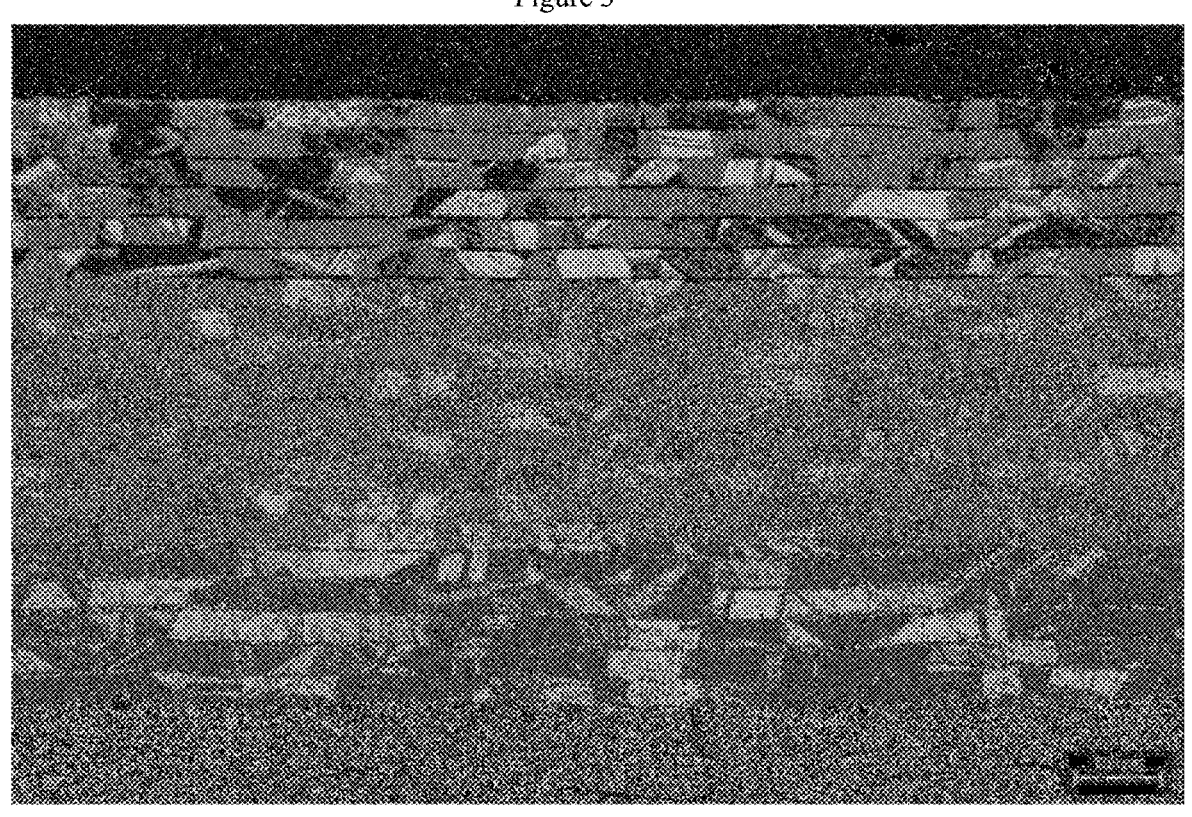
FIG. 3 is a microstructure photograph of the graphene copper composite material prepared in Example 5 of the present application.

FIG. 3 is a microstructure photograph of the graphene copper composite material prepared in Example 5 of the present application.

Table 1 lists the raw material components, preparation process parameters, and product performance parameters of Examples 1 to 14.

Graphene, as a conductive reinforcement material, has a composite effect and synergistic effect with copper material, and thereby achieving the effect of improving electrical conductivity. The results of Example 1 and Comparative Example 2 can indicate that the electrical performance of the copper-based composite material is increased from 100% IACS to 106% IACS, the temperature rise is decreased and the efficiency is increased after the addition of graphene.

It can be seen from the comparison between Example 2 and Example 11 that after the number of graphene layers exceeds 5, the properties of graphene change, and it will exist in the copper matrix in the form of free carbon, which is equivalent to the existence of impurity elements, thereby generating lattice defects and resulting in the decrease in conductivity.

It can be seen from the comparison results of Examples 11, 12, and 13 that as the purity of the raw materials increases, the electrical performance is improved.

It can be seen from the comparison results of Examples 2, 3, and 4 that the increase in the hot pressing temperature can improve the composite effect of copper and graphene, and improve the electrical conductivity.

For application verification, a flat-panel transformer test of the graphene-modified metal material was conducted, and the test results are shown in Table 1.

The thermal conductivity test was conducted in accordance with GB/T22588-2008; the tensile strength test was conducted in accordance with GB/T228.1-2010; the electrical conductivity test was conducted in accordance with T/CSTM 00591-2022; the efficiency test was conducted in accordance with the "GB/18613-2016 Minimum allowable values of energy efficiency and energy efficiency grades for small and medium three-phase asynchronous motors"; and temperature rise test was conducted under the following conditions: a voltage of 440 V, a current of 38 A, a frequency of 60 Hz, room temperature of 20° C., and stator winding temperature rise was detected.

The results show that the temperature rise is decreased by 2.4° C. and the efficiency is increased by 2.8%.

process with methane as a carbon source to obtain a graphene copper raw material; and c) performing hot pressing sintering forming on the graphene copper raw material by means of a hot pressing sintering process to obtain a graphene copper composite material, wherein the preparation of the graphene thin film in step (b) and the hot pressing sintering process in step (c) are performed in the hot pressing chamber.

2. The graphene copper composite material preparation method of claim 1, wherein the spacing between layers of copper foils is controlled between 0.1 to 1 mm.

3. The graphene copper composite material preparation method of claim 2, wherein the copper foil has a purity of 99.9% to 99.9999%.

4. The graphene copper composite material preparation method of claim 2, wherein the copper foil is a rolled copper foil with an orientation of (111).

5. The graphene copper composite material preparation method of claim 2, wherein the copper foil has a thickness of 15 to 25 μM.

6. The graphene copper composite material preparation method of claim 2, wherein the method further includes the step of performing a hydrogen reduction treatment on the copper foil to remove gas adsorbed on the surface and oxide layer before depositing a graphene thin film.

TABLE 1

| | Process control | | | | | | Product performance parameters | | | |
| | CVD process | | | Hot pressing process | | | Electrical | Thermal | Application verification | |
| Examples | Copper foil/ purity/% | Number of graphene layers/N | Deposition temperature/ ° C. | Pressure/ MPa | Temperature/ ° C. | Layer | conductivity/ IACS % | conductivity/ W/(m · k) | Temperature rise/° C. | Efficiency/ % |
|---|---|---|---|---|---|---|---|---|---|---|
| 1 | 99.99 | — | — | 40 | 950 | 20 | 100 | 385 | 95 | 91 |
| 2 | 99.99 | 1 | 900 | 40 | 950 | 100 | 106 | 385 | 91.2 | 93.6 |
| 3 | 99.99 | 2 | 950 | 40 | 950 | 200 | 109 | 403 | 91.3 | 94.2 |
| 4 | 99.99 | 5 | 1020 | 40 | 950 | 200 | 110 | 392 | 90.4 | 92.4 |
| 5 | 99.99 | 2 | 950 | 40 | 800 | 200 | 112 | 415 | 89.3 | 92.2 |
| 6 | 99.99 | 2 | 950 | 40 | 1000 | 500 | 114 | 375 | 89.2 | 93.1 |
| 7 | 99.99 | 1 | 950 | 40 | 1030 | 300 | 110 | 408 | 89.4 | 94.4 |
| 8 | 99.99 | 1 | 950 | 25 | 950 | 100 | 110 | 410 | 89.5 | 93.4 |
| 9 | 99.99 | 2 | 950 | 55 | 950 | 800 | 107 | 383 | 91.4 | 92.3 |
| 10 | 99.99 | 5 | 950 | 40 | 950 | 100 | 110 | 403 | 88.3 | 97.2 |
| 11 | 99.999 | 2 | 950 | 40 | 950 | 200 | 115 | 400 | 88.2 | 97.4 |
| 12 | 99.99 | 18 | 950 | 40 | 950 | 200 | 102 | 380 | 94.5 | 92 |
| 13 | 95 | 2 | 950 | 40 | 950 | 200 | 98 | 375 | 96 | 91 |
| 14 | 99.99 | 2 | 1000 | 40 | 980 | 100 | 110 | 390 | 89.5 | 95 |

Although the present application has been described in detail with general descriptions and specific embodiments in the above context, it is obvious to a person skilled in the art that some modifications or improvements can be made based on the present application. Therefore, these modifications or improvements made without departing from the spirit of the present application shall fall within the protection scope claimed by the present application.

What is claimed is:

1. A graphene copper composite material preparation method, comprising:

a) presetting multi-layers of copper foils in a hot pressing chamber;

b) preparing a graphene thin film on the surface of the copper foil by means of a chemical vapor deposition 7. The graphene copper composite material preparation method of claim 1, wherein the copper foils have a purity of 99.9% to 99.9999%.

8. The graphene copper composite material preparation method of claim 7, wherein the copper foil is a rolled copper foil with an orientation of (111).

9. The graphene copper composite material preparation method of claim 7, wherein the copper foil has a thickness of 15 to 25 μM.

10. The graphene copper composite material preparation method of claim 7, wherein the method further includes the step of performing a hydrogen reduction treatment on the copper foil to remove gas adsorbed on the surface and oxide layer before depositing a graphene thin film.

11. The graphene copper composite material preparation method of claim 1, wherein each of the copper foils is a rolled copper foil with an orientation of (111).

12. The graphene copper composite material preparation method of claim 11, wherein the copper foil has a thickness of 15 to 25 µM.

13. The graphene copper composite material preparation method of claim 11, wherein the method further includes the step of performing a hydrogen reduction treatment on the copper foil to remove gas adsorbed on the surface and oxide layer before depositing a graphene thin film.

14. The graphene copper composite material preparation method of claim 1, wherein the copper foil has a thickness of 15 to 25 µM.

15. The graphene copper composite material preparation method of claim 14, wherein the method further includes the step of performing a hydrogen reduction treatment on the copper foil to remove gas adsorbed on the surface and oxide layer before depositing a graphene thin film.

16. The graphene copper composite material preparation method of claim 1, wherein the method further includes the step of performing a hydrogen reduction treatment on the copper foil to remove gas adsorbed on the surface and oxide layer before depositing a graphene thin film.

17. The graphene copper composite material preparation method of claim 1, wherein the vapor deposition process is performed at a temperature of 950° C. to 1020° C.; and/or, graphene is deposited on both the upper and lower sides of the copper foil, and the number of layers of the prepared graphene thin film is optionally 1 to 5 layers; and/or, the hot pressing sintering is performed under a hot pressing atmosphere of a high vacuum, a hot pressing temperature of 850° C. to 1050° C., and a pressure of 20 MPa to 60 MPa.

18. The graphene copper composite material preparation method of claim 1, wherein the total number of layers of the graphene copper composite material is 10 to 1000 layers.

\* \* \* \* \*